US008735296B2

(12) United States Patent
Jung et al.

(10) Patent No.: US 8,735,296 B2
(45) Date of Patent: May 27, 2014

(54) METHOD OF SIMULTANEOUSLY FORMING MULTIPLE STRUCTURES HAVING DIFFERENT CRITICAL DIMENSIONS USING SIDEWALL TRANSFER

(75) Inventors: Ryan O. Jung, Rensselaer, NY (US); Sivananda K. Kanakasabapathy, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/552,035

(22) Filed: Jul. 18, 2012

(65) Prior Publication Data

US 2014/0024209 A1 Jan. 23, 2014

(51) Int. Cl.
*H01L 21/311* (2006.01)

(52) U.S. Cl.
USPC ........... 438/703; 438/695; 438/696; 438/699; 438/702; 438/717; 438/736; 257/E21.25; 257/E21.632; 216/72; 716/55; 716/101; 716/110

(58) Field of Classification Search
CPC ............ H01L 21/0338; H01L 21/3088; H01L 21/0337
USPC ......... 438/696, 703, 154, 199, 695, 699, 702, 438/717, 736; 257/E21.023, E21.25, 257/E21.632; 216/72; 716/55, 101, 110
See application file for complete search history.

(56) References Cited

U.S. PATENT DOCUMENTS

| | | | |
|---|---|---|---|
| 4,776,922 A | 10/1988 | Bhattacharyya et al. | |
| 5,795,830 A * | 8/1998 | Cronin et al. ................. | 438/696 |
| 6,063,688 A * | 5/2000 | Doyle et al. .................. | 438/424 |
| 6,300,221 B1 * | 10/2001 | Roberds et al. ............... | 438/435 |
| 6,335,257 B1 * | 1/2002 | Tseng .......................... | 438/397 |
| 7,087,532 B2 * | 8/2006 | Dobuzinsky et al. ......... | 438/717 |
| 7,301,210 B2 | 11/2007 | Abadeer et al. | |
| 7,390,746 B2 * | 6/2008 | Bai et al. ...................... | 438/689 |
| 7,699,996 B2 | 4/2010 | Furukawa et al. | |
| 7,763,531 B2 | 7/2010 | Abadeer et al. | |
| 7,807,575 B2 * | 10/2010 | Zhou ............................ | 438/696 |
| 7,919,413 B2 * | 4/2011 | Chen ............................ | 438/692 |
| 8,030,217 B2 | 10/2011 | Niroomand et al. | |
| 8,099,686 B2 * | 1/2012 | Schultz ......................... | 716/55 |
| 8,123,968 B2 | 2/2012 | Bai et al. | |
| 8,168,377 B2 * | 5/2012 | Mitsuoka et al. ............. | 430/325 |
| 8,173,357 B2 * | 5/2012 | Nishimura ................... | 430/312 |
| 8,314,034 B2 * | 11/2012 | Tan et al. ...................... | 438/717 |
| 8,324,036 B2 * | 12/2012 | Cheng et al. .................. | 438/165 |
| 8,383,448 B2 * | 2/2013 | Kao .............................. | 438/75 |
| 8,394,710 B2 * | 3/2013 | Cheng et al. .................. | 438/558 |
| 2002/0045308 A1 * | 4/2002 | Juengling .................... | 438/238 |
| 2005/0164454 A1 * | 7/2005 | Leslie .......................... | 438/269 |
| 2007/0292996 A1 | 12/2007 | Abadeer et al. | |
| 2008/0258188 A1 * | 10/2008 | Kao .............................. | 257/292 |
| 2009/0246954 A1 * | 10/2009 | Miyoshi et al. .............. | 438/689 |

(Continued)

FOREIGN PATENT DOCUMENTS

WO 2011054664 5/2011

*Primary Examiner* — Marvin Payen
*Assistant Examiner* — Victor Barzykin
(74) *Attorney, Agent, or Firm* — Schmeiser, Olsen & Watts;

(57) ABSTRACT

A method of forming multiple different width dimension features simultaneously. The method includes forming multiple sidewall spacers of different widths formed from different combinations of conformal layers on different mandrels, removing the mandrels, and simultaneously transferring the pattern of the different sidewall spacers into an underlying layer.

25 Claims, 8 Drawing Sheets

(56) References Cited

U.S. PATENT DOCUMENTS

| | | | |
|---|---|---|---|
| 2010/0144151 A1* | 6/2010 | Sills et al. | 438/694 |
| 2010/0248481 A1* | 9/2010 | Schultz | 438/694 |
| 2011/0014786 A1* | 1/2011 | Sezginer et al. | 438/618 |
| 2011/0049630 A1* | 3/2011 | Majumdar et al. | 257/351 |
| 2011/0076850 A1* | 3/2011 | Sumioka | 438/703 |
| 2011/0113393 A1* | 5/2011 | Sezginer | 716/106 |
| 2011/0117743 A1* | 5/2011 | Bai et al. | 438/696 |
| 2011/0130006 A1* | 6/2011 | Abatchev et al. | 438/703 |
| 2012/0118854 A1* | 5/2012 | Smayling et al. | 216/37 |
| 2012/0132616 A1* | 5/2012 | Barnola et al. | 216/41 |
| 2012/0164390 A1* | 6/2012 | Washburn et al. | 428/172 |
| 2012/0164837 A1* | 6/2012 | Tan et al. | 438/703 |
| 2012/0241975 A1* | 9/2012 | Farys et al. | 257/774 |
| 2012/0252175 A1* | 10/2012 | Majumdar et al. | 438/154 |
| 2013/0001749 A1* | 1/2013 | Arnold et al. | 257/618 |
| 2013/0001750 A1* | 1/2013 | Arnold et al. | 257/618 |
| 2013/0032945 A1* | 2/2013 | Lin et al. | 257/774 |
| 2013/0032949 A1* | 2/2013 | Lin et al. | 257/774 |
| 2013/0089984 A1* | 4/2013 | Raghunathan et al. | 438/696 |

\* cited by examiner

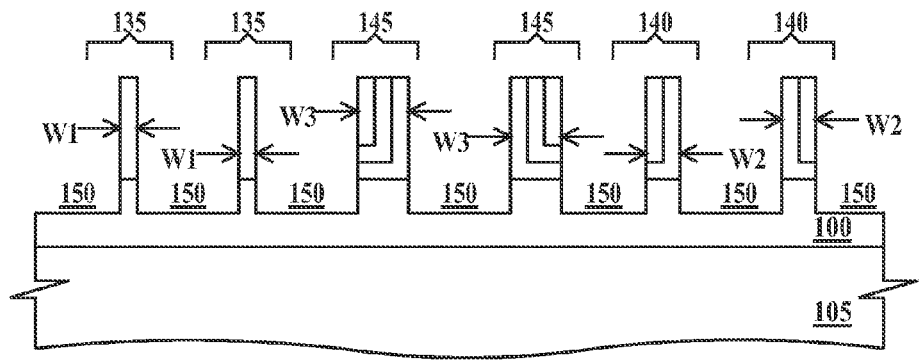
FIG. 1M1A
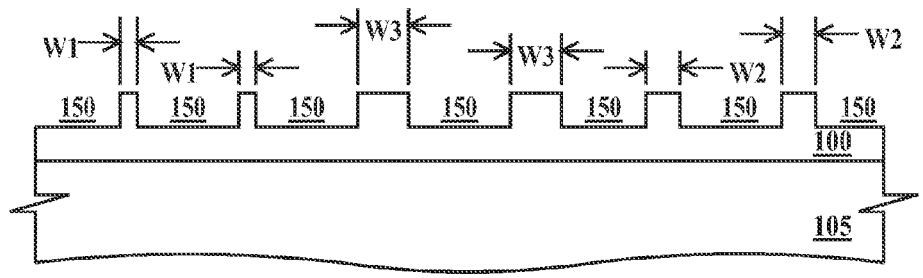
FIG. 1M1B
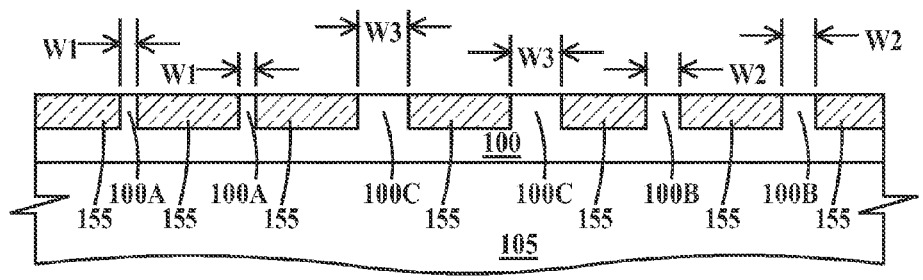
FIG. 1M1C
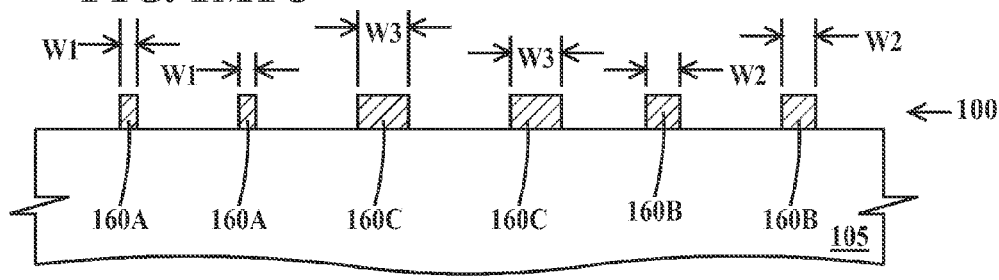
FIG. 1M1D

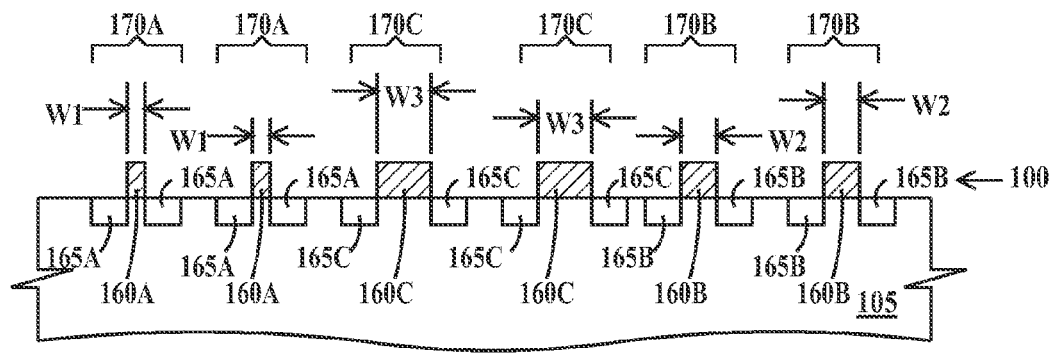
*FIG. 1M1E*
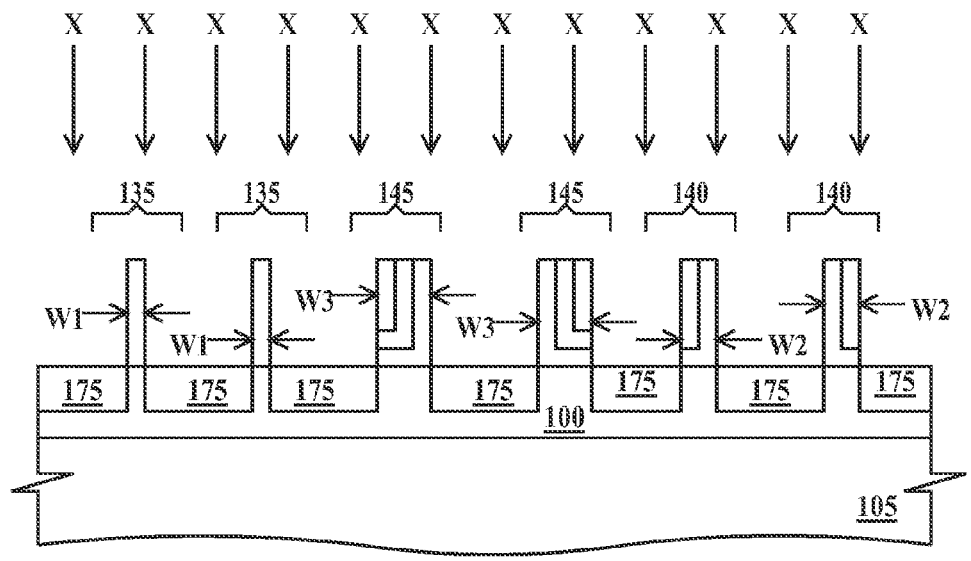
*FIG. 1M2A*
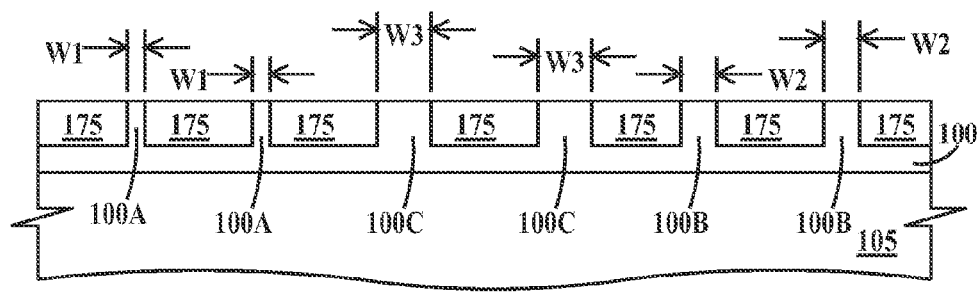
*FIG. 1M2B*

US 8,735,296 B2

METHOD OF SIMULTANEOUSLY FORMING MULTIPLE STRUCTURES HAVING DIFFERENT CRITICAL DIMENSIONS USING SIDEWALL TRANSFER

FIELD OF THE INVENTION

The present invention relates to the field of integrated circuit manufacture; more specifically, it relates to methods of simultaneously forming multiple structures having different dimensions using sidewall transfer.

BACKGROUND

As the density and performance of integrated circuits increase, there is a corresponding decrease in the dimensions of integrated circuit structures. Sidewall image transfer techniques have been used to define integrated circuit structures of such small dimensions that are not easily or impossible to obtain using conventional photolithographic techniques. However, current sidewall image transfer techniques can only provide only one critical dimension at critical pitch in a given fabrication level. Accordingly, there exists a need in the art to eliminate the deficiencies and limitations described hereinabove.

SUMMARY

A first aspect of the present invention is a method, comprising: forming a plurality of mandrels on a layer on a substrate; forming a first conformal layer on the mandrels and on a top surface of the layer; forming a second conformal layer on the first conformal layer; forming a block mask over a second less than whole portion of the plurality of mandrels; performing an isotropic etch to remove the second conformal layer from a first less than whole portion of the plurality of mandrels where the second conformal layer is not protected by the block mask; performing an anisotropic etch of the first and second conformal layers to (i) form first sidewall spacers on the first less than whole portion of the plurality mandrels and to (ii) form second sidewall spacers on the second less than whole portion of the plurality mandrels, the first and second sidewall spacers having different widths; removing the plurality of mandrels; and using the first and second sidewall spacers as a hardmask, simultaneously transferring the pattern formed by the first and second sidewall spacers into the layer.

A second aspect of the present invention is a method, comprising: forming a first and a second mandrel on a layer on a substrate; forming a first conformal layer on sidewalls and top surfaces of the first and second mandrels and on a top surface of the layer between the first and second mandrels; forming a second conformal layer on a top surface of the first conformal layer; forming a block mask over the second mandrel and regions of the first and second conformal layers proximate to the second mandrel; using an isotropic etch, removing the second conformal layer where the second conformal layer is not protected by the block mask; removing the block mask; performing an anisotropic etch to form first sidewall spacers on the first mandrel and second sidewall spacers on the second mandrel, the first and second sidewall spacers having different widths; removing the first and second mandrels; and using the first and second sidewall spacers as a hardmask, simultaneously transferring the pattern formed by the first and second sidewall spacers into the layer.

A third aspect of the present invention is a method, comprising: forming a first, a second and a third mandrel on a layer on a substrate; forming a first conformal layer on sidewalls and top surfaces of the first, second and third mandrels and on a top surface of the layer between the first, second and third mandrels; forming a second conformal layer on a top surface of the first conformal layer; forming a first block mask over the second mandrel and regions of the first and second conformal layers proximate to the second mandrel; using a first isotropic etch, removing the second conformal layer where the second conformal layer is not protected by the first block mask; removing the first block mask; forming a third conformal layer on exposed surfaces of the first and second conformal layers; forming a second block mask on the third conformal layer over the second and third mandrels; using a second isotropic etch, removing the third conformal layer where the third conformal layer is not protected by the second block mask; performing an anisotropic etch to simultaneously form first sidewall spacers on the first mandrel, second sidewall spacers on the second mandrel and third sidewall spacers on the third mandrel, the first, second and third sidewall spacers having different widths; removing the first, second and third mandrels; and using the first, second and third sidewall spacers as a hardmask, simultaneously transferring the pattern formed by the first, second and third sidewall spacers into the layer.

A fourth aspect of the present invention is a method comprising: forming N mandrels on a top surface of a layer of a substrate, wherein N is a positive integer equal to or greater than 2; depositing N conformal layers; removing regions of N−1 conformal layers using a different block mask of N−1 block masks between depositions of each of the last 2 to N conformal layers, such that for I=1 to N, the Ith mandrel has I conformal layers on sidewall of the Ith mandrel, each of the N mandrels having a different number and a different combination of the N conformal layers; using an anisotropic etch, forming a sidewall spacer on each sidewall of the N mandrels, for I=1 to N, the Ith mandrel having a sidewall comprising only I of the N conformal layers; removing the N mandrels; and using the N sidewall spacers as a hardmask, simultaneously transferring the pattern formed by the N sidewall spacers into the layer.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIGS. 1M1A through 1M1E and 1M2A through 1M2B are cross-sectional views illustrating transferring the hard mask structures of FIG. 1L into integrated structures having different critical dimensions according to embodiments of the present invention;

DETAILED DESCRIPTION

The ability to project a clear image of a small feature on a photomask onto a photoresist layer is limited by the wavelength of the light that is used, and the ability of the reduction lens system of a projection photolithographic exposure tool to capture enough diffraction orders from the illuminated mask. Current state-of-the-art photolithography exposure tools using deep ultraviolet (DUV) light from excimer lasers with wavelengths of 248 and 193 nm allow minimum feature sizes down to about 50 nm to be directly printed. Mask features define the integrated circuit structures. The minimum feature size that a projection system can print is given approximately by:

$$CD = k_1 \frac{\lambda}{NA}$$

where:
CD is the minimum feature size (also called the critical dimension and may be expressed as ½ the critical pitch;
k1 is a coefficient that encapsulates process-related factors, and in one example equals about 0.4 for production;
λ is the wavelength of light used; and
NA is the numerical aperture of the lens of the exposure tool.

The embodiments of the present invention include methods of forming multiple different width critical dimension features simultaneously. The methods include forming multiple sidewall spacers of different widths formed from different combinations of conformal layers on different mandrels, removing the mandrels, and simultaneously transferring the pattern of the different sidewall spacers into an underlying layer.

Figure 1A:
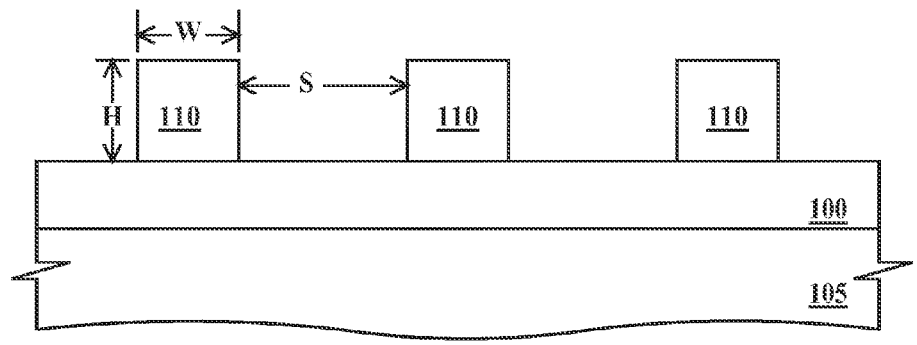
FIGS. 1A through 1L are cross-sectional views illustrating a method of forming multiple hard mask structures having different critical dimensions according to embodiments of the present invention.

FIGs. 1A through 1L are cross-sectional views illustrating a method of forming multiple hard mask structures having different critical dimensions according to embodiments of the present invention. In FIG. 1A, layer 100 is formed on a substrate 105 and a set of mandrels 110 are formed on layer 100. In one example, layer 100 may be a single crystal silicon layer. In one example, layer 100 may be a polysilicon layer. In one example, layer 100 may be a dielectric layer. In one example, substrate 105 may be a bulk single-crystal silicon layer. In one example, substrate 105 may be a silicon on insulator substrate with layer 100 being an upper single-crystal silicon layer and substrate 105 includes a lower single crystal silicon layer and a buried oxide layer between and abutting the upper and lower layers. Mandrels 110 are photolithographically defined and are spaced apart a distance S, have a height H and have a minimum width W. In one example, S, H and W are greater than a critical dimension (CD) defined supra. In one example, CD is about 80 nm. In one example, mandrels 110 are formed simultaneously and defined by a single photomask. In one example, W is about 20 nm to about 50 nm. In one example, H is about 50 nm to about 100 nm. In one example, S is about 30 nm to about 200 nm. In one example, S is greater than 200 nm. In one example, mandrels 115 comprise hardened photoresist (e.g., photoresist that has been exposed and then baked or UV hardened). In one example, mandrels 110 comprise a dielectric material such as silicon oxide or silicon nitride that was formed by etching away material not protected by a patterned photoresist layer.

Figure 1B:
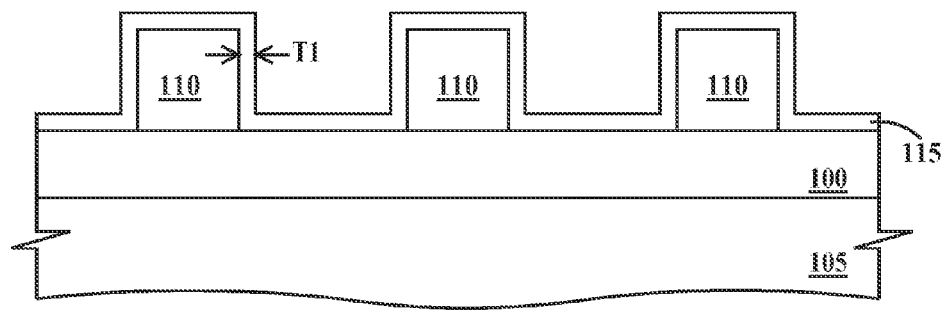
Figure 1C:
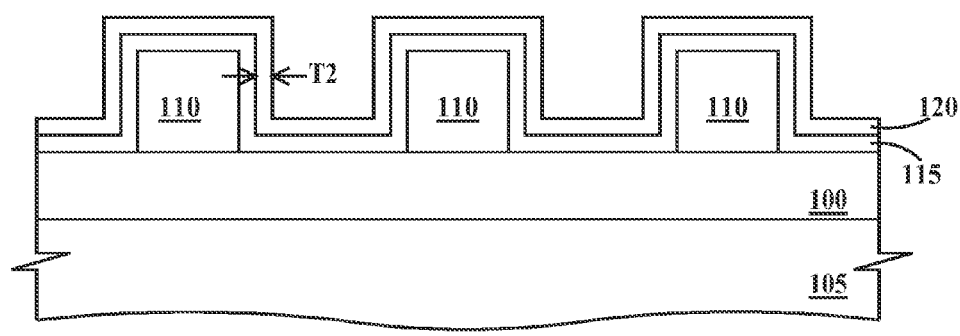
Figure 1D:
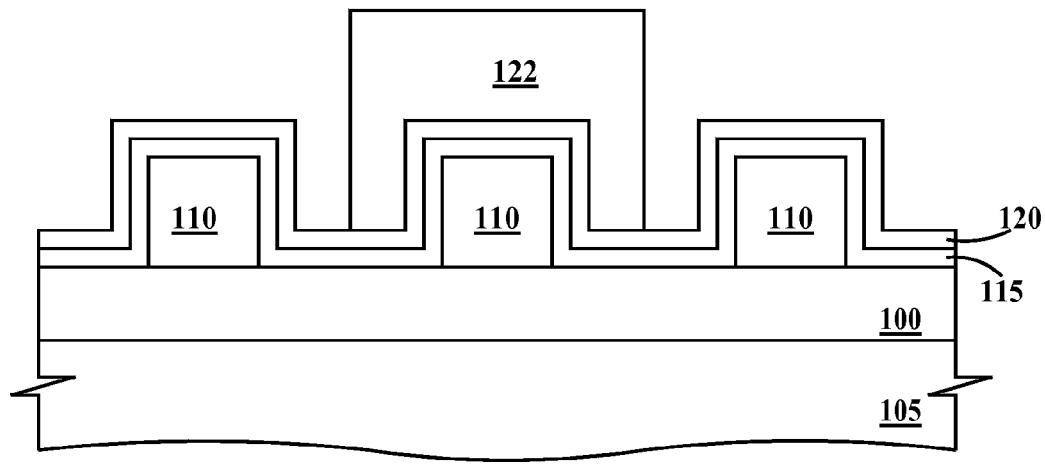
Figure 1E:
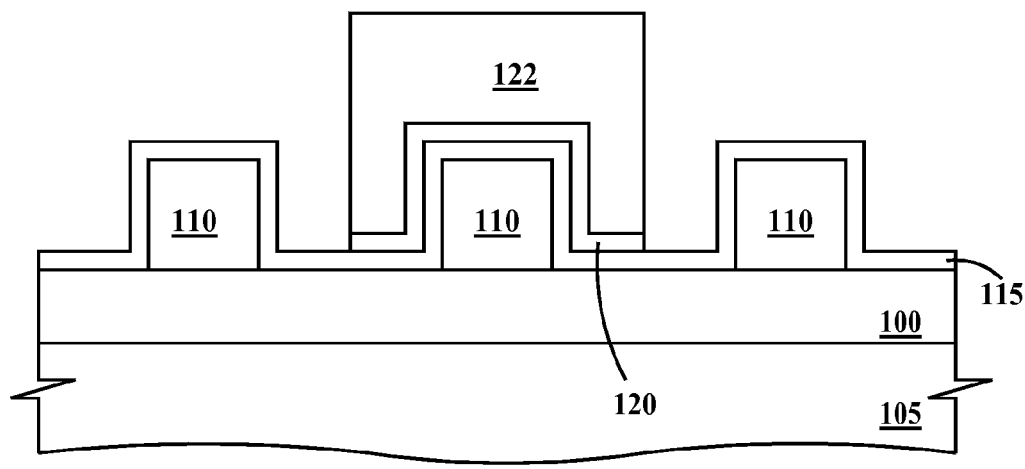
Figure 1F:
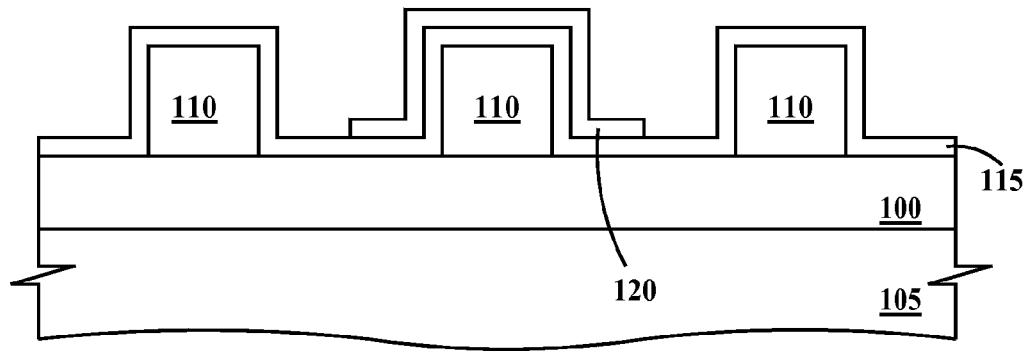

In FIG. 1B, a first conformal layer 115 is deposited on the tops and sidewalls of mandrels 110 and the top surface of layer 100 not covered by the mandrels. In one example, first conformal layer 115 is silicon nitride. First conformal layer 115 has a thickness T1. In one example, T1 is about 1 nm to about 5 nm. In one example, T1 is about 1 nm to about 10 nm. In FIG. 1C, a second conformal layer 120 is deposited on first conformal layer 115. In one example, second conformal layer 120 is silicon oxide. Second conformal layer 120 has a thickness T2. In one example, T2 is about 1 to about 5 nm. In one example, T2 is about 1 nm to about 5 nm. The space between mandrels 110 is not completely filled by first conformal layer 115 or second conformal layer 120. In FIG. 1D, a first photolithographic process is performed to form a photoresist block mask 122 over the middle mandrel 110. In FIG. 1E, second conformal layer 120 is removed using an isotropic etch, that is selective to second conformal layer 120, where the second conformal layer is not protected by block mask 122. A selective etch is an etch process where one layer is selectively removed at a faster rate than another layer or where one layer is selectively removed and another layer is not removed. Thus, a selective etch is selective to the layer that it is to be removed. In FIG. 1F, first block mask 122 (see FIG. 1E) is removed.

Figure 1G:
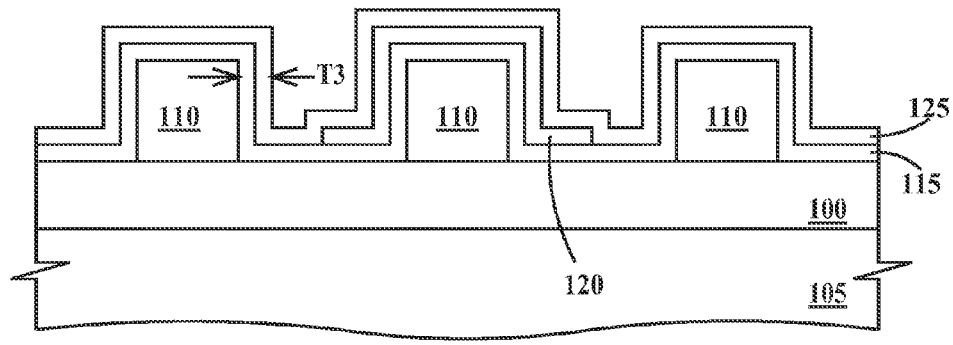
Figure 1H:
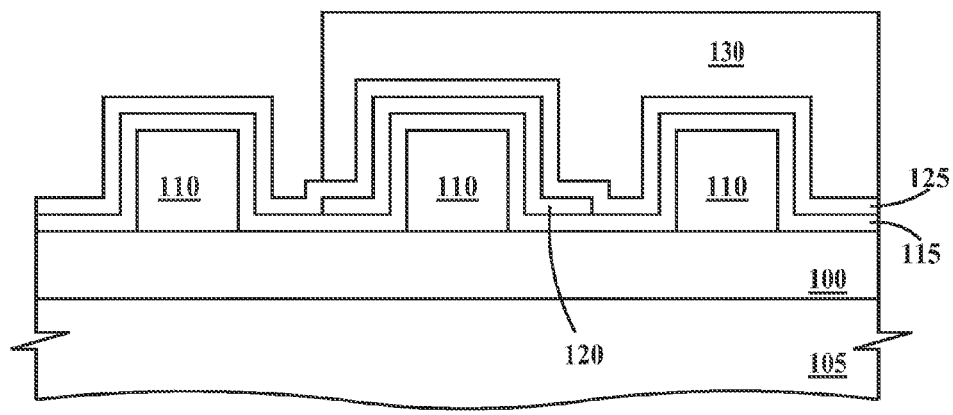
Figure 1I:
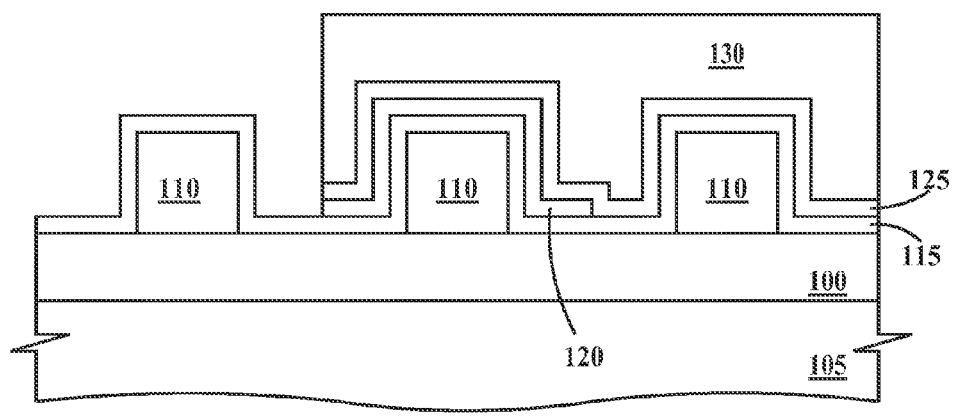
Figure 1J:
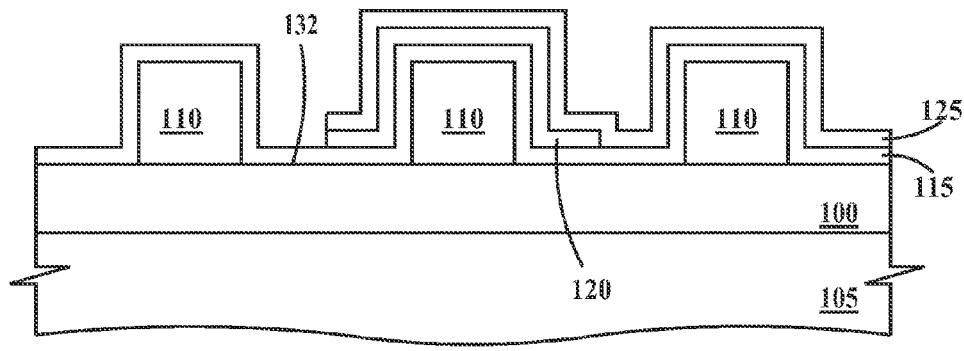

In FIG. 1G, a third conformal layer 125 is deposited on exposed regions of first conformal layer 115 (see FIG. 1F) and the remaining portions of second conformal layer 120. Third conformal layer 125 has a thickness T3. In one example, T3 is about 10 nm. In one example, third conformal layer 125 is silicon oxide. The space between mandrels 110 is not completely filled by third conformal layer 125. In FIG. 1H, a second photolithographic process is performed to form a photoresist block mask 130 over the middle and rightmost mandrels 110. In FIG. 1I, third conformal layer 125 is removed using an isotropic etch selective to conformal layer 120 where conformal layer 125 is not protected by second block mask 130. In FIG. 1J, second block mask 130 (see FIG. 1I) is removed.

Figure 1K:
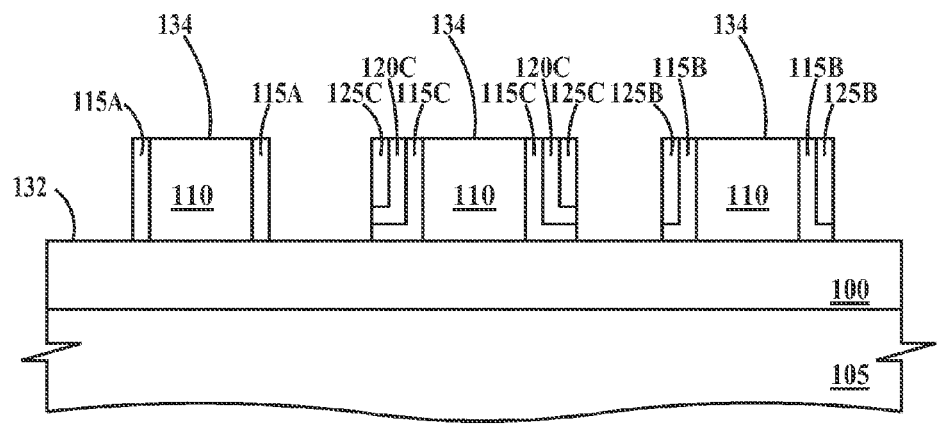

In FIG. 1K, a non-selective (to the materials of first conformal layer 115, second conformal layer 120 and third conformal layer 125) and anisotropic etch is performed to remove horizontal (relative to top surface 132 of layer 100) regions of first conformal layer 115, second conformal layer 120 and third conformal layer 125 (see FIG. 1J) to leave remaining regions 115A, 115B, 115C of conformal layer 115 (see FIG. 1J), remaining regions, 120C of conformal layer 120 and remaining regions 125B and 125C of conformal layer 125 (see FIG. 1J). Alternatively, three separate and selective anisotropic etches may be used, one for each of the three conformal layers. After the anisotropic etch is performed, top surfaces 134 of mandrels 110 are exposed as well as regions of top surface 132 of layer 100 that do not lie under remaining regions 115B and 115C. Only remaining regions 115A are formed on the sidewalls of leftmost mandrel 110, there are no remaining regions of conformal layers 120 or 125 on or over the sidewalls leftmost mandrel 110. Only remaining regions 115C and 125C are formed over the sidewalls of rightmost mandrel 110, there are no remaining regions of conformal layer 120 on or over the sidewalls of rightmost mandrel 110. The three remaining regions 115B, 120B and 125B are formed on or over the sidewalls of middle mandrel 110. An example of an anisotropic etch is a reactive ion etch (RIE).

Figure 1L:
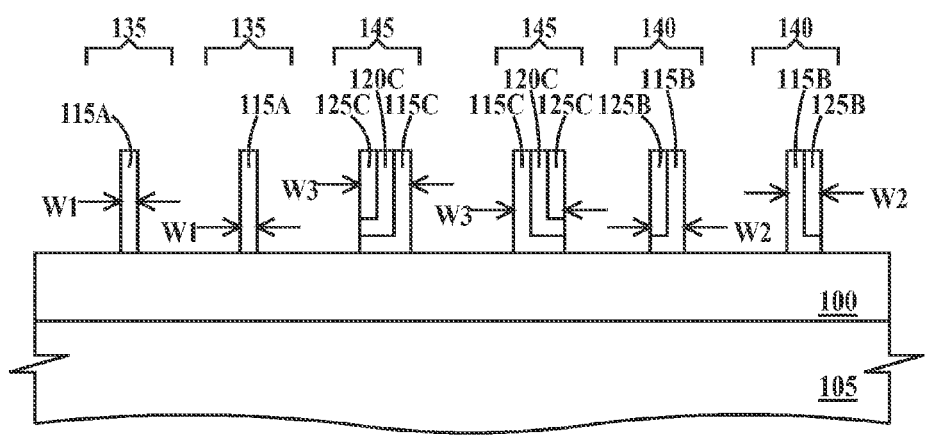

In FIG. 1L, mandrels 110 (see FIG. 1J) are removed leaving only the sidewall spacers 135, 140 and 145 behind. Spacers 135 comprise only remaining regions 115A and do not comprise any remaining regions of conformal layers 120 or 125 (see FIG. 1J). Spacers 140 comprise only regions 115B and 125B and do not comprise any remaining regions of conformal layer 120 (see FIG. 1J). Spacers 145 comprise remaining regions 115C, 120C and 125C. Mandrels 110 are removed using an etch process selective to the material of the mandrels. In FIG. 1L, remaining regions 125B of spacers 140 do not abut layer 100 as remaining regions 115B intervene. In FIG. 1L, remaining regions 120C of spacers 145 do not abut layer 100 as remaining regions 115C intervene and remaining regions 125C of spacers 145 do not abut layer 100 as remaining regions 115C and 120C intervene. Sidewall spacers 135 have a thickness of about W1, sidewall spacers 140 have a thickness of about W2 and sidewall spacers 145 have a thickness of about W3 allowing for some very slight sidewall erosion during the etch step of FIG. 1K and during mandrel removal. At least W1 and W2 are less than the critical dimension of the photolithographic exposure tool used to define mandrels 110 (see FIG. 1A). W3 may be less than CD or greater than CD.

FIGS. 1M1A through 1M1E and 1M2A through 1M2B are cross-sectional views illustrating transferring the sidewall spacer structures of FIG. 1L into integrated structures having different critical dimensions according to embodiments of the present invention.

FIGS. 1M1A through 1M1C illustrate forming trench isolation when layer 100 is silicon. In FIG. 1MA1, layer 100 is etched using spacers 135, 140 and 145 as hardmasks to form trenches 150. In FIG. 1M1B, sidewall spacers 135, 140 and 145 are removed. In FIG. 1M1C, trenches 150 (see FIG. 1M1A) are filled with a dielectric material to form trench isolation 155. Some regions of trench isolation 155 are separated by regions 100A of layer 100 that are W1 wide, some of regions of trench isolation 155 are separated by regions 100B of layer 100 that are W2 wide, and some of regions of trench isolation 155 are separated by regions 100C of layer 100 that are W3 wide. Since at least W1 and W2 are less than the critical dimension of the photolithographic exposure tool used to define mandrels 110 (see FIG. 1A), at least two different critical dimension features regions have been formed simultaneously.

FIGS. 1M1D and 1M1E illustrate forming gate electrodes of transistors when layer 100 is a layer of polysilicon over a layer of gate dielectric. In FIG. 1M1D, the pattern and horizontal dimensions of sidewall spacers 135, 140 and 145 of FIG. 1M1A have been transferred into layer 100 and the sidewall spacers removed to form gate electrodes 160A, 160B and 160C having respective widths W1, W2 and W3. Since at least W1 and W2 are less than the critical dimension of the photolithographic exposure tool used to define mandrels 110 (see FIG. 1A), at least two different critical dimension features regions have been formed simultaneously.

In FIG. 1M1E additional processing has been performed to supply source/drains 165A, 165B and 165C, forming respective field effect transistors 170A, 170B and 170C.

FIGS. 1M2A and 1M2B, illustrate forming doped wells 175 when layer 100 is a layer of silicon. In FIG. 1M2A, an ion implantation of dopant species X (e.g., Ge, As, P or B) using sidewall spacers 135, 140 and 145 as ion implantation block masks to form doped wells 175 having the inverse pattern of sidewall spacers 135, 140 and 145. In FIG. 1M2B sidewall spacers 135, 140 and 145 are removed. Some regions of doped wells 175 are separated by regions 100B of layer 100 that are W1 wide, some of regions of doped wells 175 are separated by regions 100B of layer 100 that are W2 wide, and some of regions of doped wells 175 are separated by regions 100C of layer 100 that are W3. Since at least W1 and W2 are less than the critical dimension of the photolithographic exposure tool used to define mandrels 110 (see FIG. 1A), at least two different critical dimension features regions have been formed simultaneously.

Figures 3, 4:
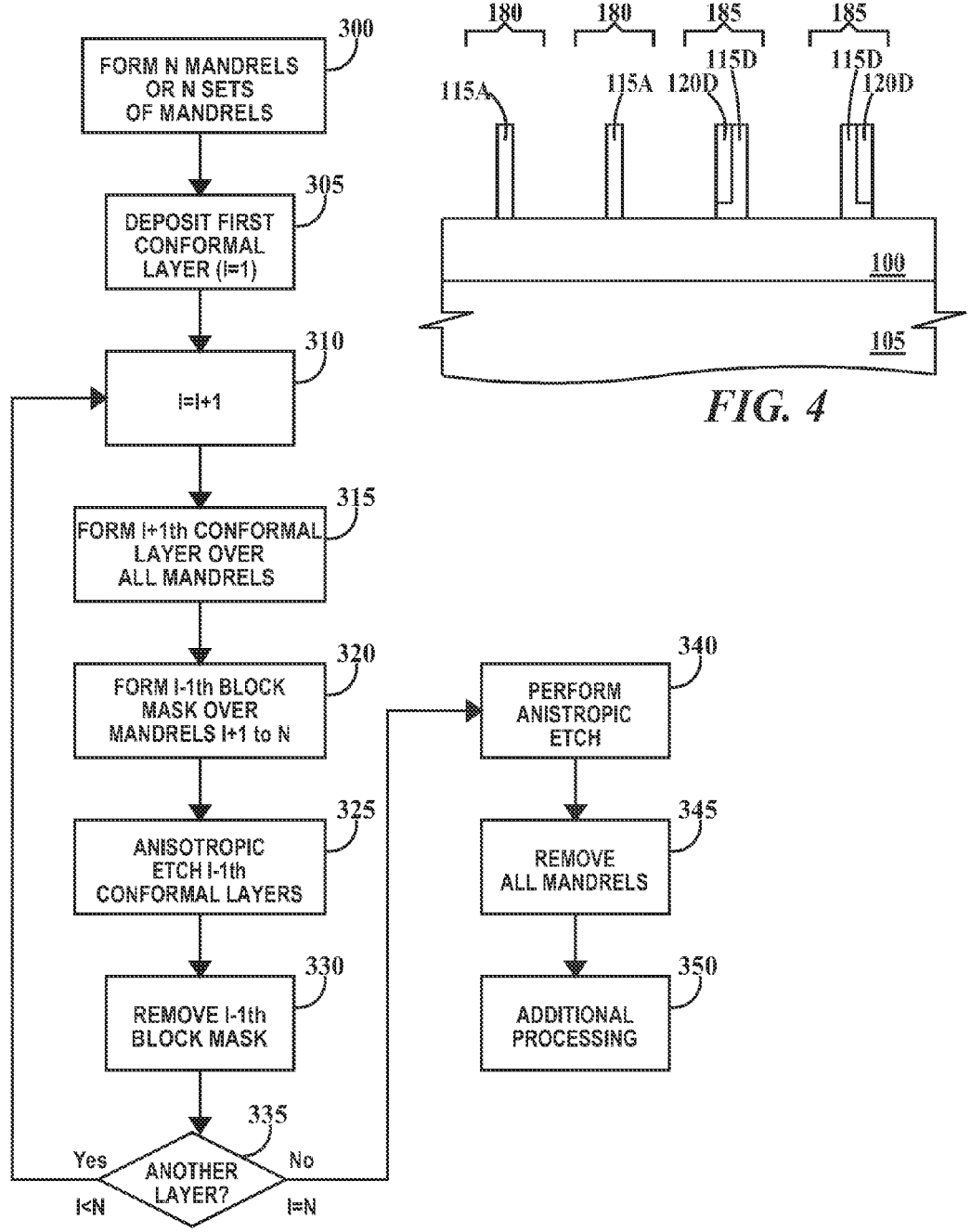
FIG. 3 is a flowchart illustrating the steps to form N different critical dimension structures according to embodiments of the present invention.
FIG. 4 illustrates a structure resulting when only two conformal layers are used according to embodiments of the present invention.

If the steps illustrated in FIGS. 1G through 1J are skipped, and the steps illustrated in FIGS. 1K and 1L performed, then sidewall spacers 180 and 185 of FIG. 4 will be formed. Sidewall spacers 180 are the same as sidewall spacers 135 of FIG. 1L. Sidewall spacers 185 are similar to sidewall spacer 140 of FIG. 1L except a remaining region 120D replaces remaining region 125B of FIG. 1L.

In the embodiments described supra, the three critical dimensions W1, W2 and W3 are determined by the thickness of the three sidewall spacers. For example, if all three sidewalls spacers were 10 nm thick, then W1=10 nm, W2=20 nm and W3=30 nm. For example, if the first sidewall spacer is 10 nm thick, the second sidewall spacer is 20 nm thick and the third sidewall spacer is 30 nm thick, then W1=10 nm, W2=30 nm and W3=60 nm.

Figure 2:
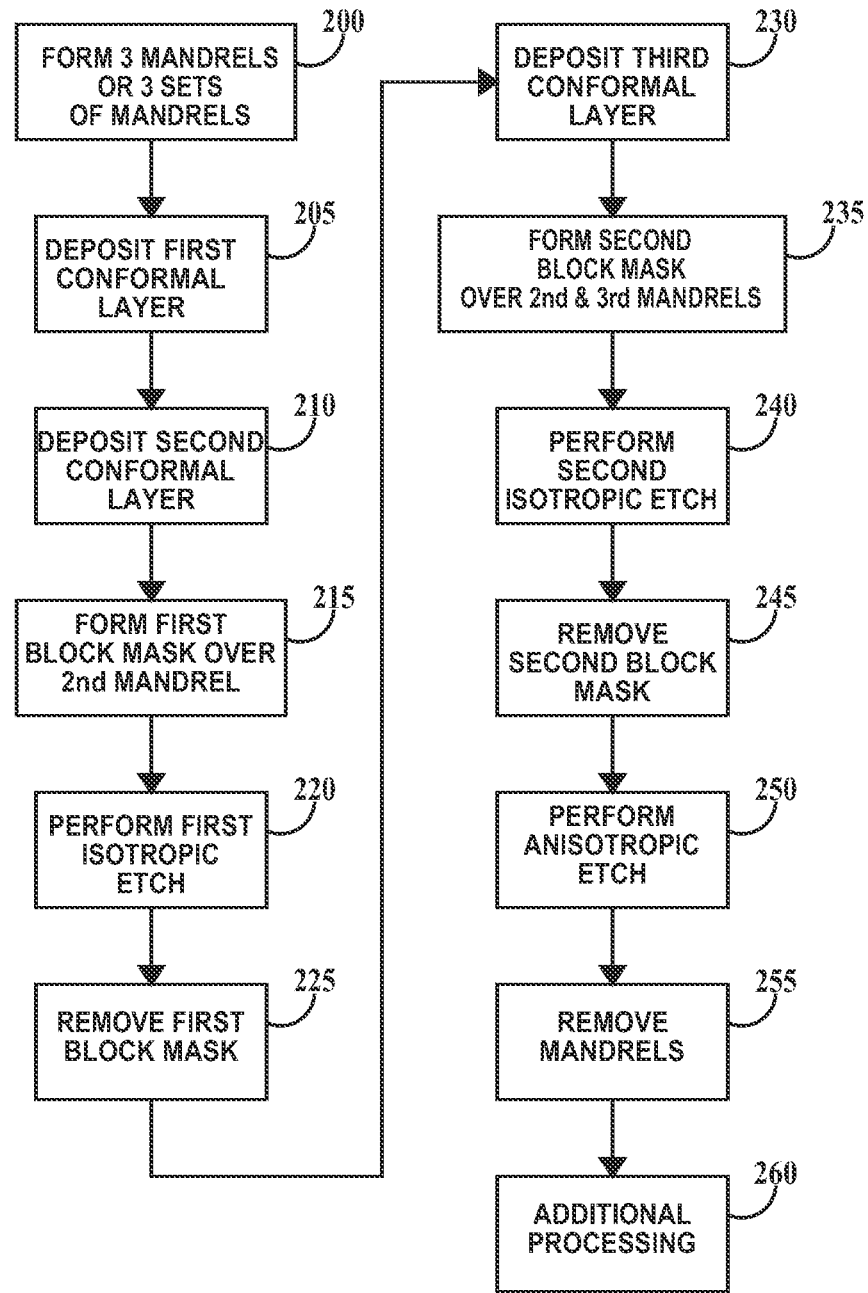
FIG. 2 is a flowchart illustrating the steps to form three different critical dimension structures according to embodiments of the present invention.

FIG. 2 is a flowchart illustrating the steps to form three different critical dimension structures according to embodiments of the present invention. In step 200, a first, second and third mandrels or first, second and third sets of mandrels are formed on a surface of a substrate (FIG. 1A). In step 205, a first conformal layer is deposited on the tops and sides of the mandrels and on the top surface of the substrate not covered by the mandrels (FIG. 1B). In step 210 a second conformal layer is deposited on the first conformal layer (FIG. 1C). In step 215 a first block mask is formed over the second mandrel or over all the mandrels of the second set of mandrels (FIG. 1D). In step 220, a first isotropic etch is performed to completely remove the second conformal layer where the second conformal layer is not protected by the first block mask. The first conformal layer is not removed or not completely removed (FIG. 1E). In step 225, the first block mask is removed (FIG. 1F). In step 230, a third conformal layer is deposited on the remaining second conformal layer and regions of the first conformal layer not covered by the second conformal layer (FIG. 1G). In step 235, a second block mask is formed over the second and third mandrels or over all mandrels of the second and third sets of mandrels (FIG. 1H). In step 240, a second isotropic etch is performed to remove the third conformal layer from the first mandrel or all mandrels of the first set of mandrels not protected by the second block mask (FIG. 1I). In step 245, the second block mask is removed (FIG. 1J). In step 250 an anisotropic etch is performed to remove the first, second and third conformal layers from all horizontal surfaces (i.e., surfaces parallel to the top surface of the substrate). The first conformal layer becomes a first and only sidewall spacer on the first mandrel or all mandrels of the first set of mandrels. The first conformal layer becomes a first sidewall spacer and the second conformal layer becomes a second sidewall spacer on the first sidewall spacer of the third mandrel or all mandrels of the third set of mandrels. The first conformal layer becomes a first sidewall spacer and the second conformal layer becomes a second sidewall spacer on the first sidewall spacer and the third conformal layer becomes a third sidewall spacer on the second sidewall spacer of the second mandrel or all mandrels of the second set of mandrels (FIG. 1K). In step 255, the mandrels are removed leaving the spacers (FIG. 1L). In step 260, additional processing is performed (FIGS. 1M1A through 1M2B).

FIG. 3 is a flowchart illustrating the steps to form N different critical dimension structures according to embodiments of the present invention. In step 300, N mandrels or N sets of mandrels are formed on a surface of a substrate. In FIG. 2, N=3. In step 305, a first conformal layer (I=1) is deposited on the tops and sides of the mandrels and on the top surface of the substrate not covered by the mandrels. Step 310 is just a device to increment the value of I. In step 315, an I+1 conformal layer is deposited on the Ith conformal layer over all mandrels. In step 320, an I−1th block mask is formed over the mandrels I−1 to 1 or over all the mandrels of the mandrel sets I+1 to N. In step 325, an I−1th isotropic etch is performed to completely remove the F−1th conformal layer where the I+1th conformal layer is not protected by the I−1th block mask. In step 330, the I−1th block mask is removed. In step 335, if another conformal layer is to be deposited (I<N) the method loops to step 310, other wise (I=N) and the method proceeds to step 340. In step 340, an anisotropic etch is performed to remove the N conformal layers from all horizontal surfaces (i.e., surfaces parallel to the top surface of the substrate). In step 345, all mandrels are removed leaving the spacers. In step 350, additional processing is performed.

Thus, the embodiments of the present invention provide a sidewall image transfer method that can provide multiple critical dimensions at critical pitch in a given fabrication level.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming a plurality of mandrels on a layer on a substrate;
   forming a first conformal layer on said mandrels and on a top surface of said layer;
   forming a second conformal layer on said first conformal layer;
   forming a block mask over a second less than whole portion of said plurality of mandrels;
   performing an isotropic etch to completely remove said second conformal layer from a first less than whole portion of said plurality of mandrels where said second conformal layer is not protected by said block mask;
   performing an anisotropic etch of said first and second conformal layers, said anisotropic etch forming first sidewall spacers on said first less than whole portion of said plurality mandrels, said first sidewall spacers comprise first regions of said first conformal layer and no regions of said second conformal layer and forming second sidewall spacers on said second less than whole portion of said plurality mandrels, said second sidewall spacers comprise second regions of said first conformal layer and regions of said second conformal layer on said second regions of said first conformal layer, said first and second sidewall spacers having different widths, a width of said first sidewall spacers based on a thickness of said first conformal layer on sidewalls of said first less than whole portion of said plurality of mandrels and a width of said second sidewall spacers based on a thickness of said first and second conformal layers on sidewalls of said second less than whole portion of said plurality of mandrels;
   removing said plurality of mandrels; and
   using said first and second sidewall spacers as a hardmask, simultaneously transferring the pattern formed by said first and second sidewall spacers into said layer.

2. The method of claim 1, wherein:
   a width of said first sidewall spacers proximate to said top surface of said layer is about equal to the thickness of said first conformal layer; and
   a width of said second sidewall spacers proximate to said top surface of said layer is about equal to the thickness of said first conformal layer plus the thickness of said second conformal thickness.

3. The method of claim 1, wherein said anisotropic etch removes said first conformal layer from top surfaces of mandrels of said first less than whole portion of said plurality of mandrels, removes said first and second conformal layers from over top surfaces of mandrels of said second less than whole portion of said plurality of mandrels and from regions of said top surface of said layer between said plurality of mandrels.

4. The method of claim 1, wherein said forming a block mask over a first less than whole portion of said plurality of mandrels includes forming said block mask over regions of said first and second conformal layers proximate to mandrels of said second less than whole portion of said plurality of mandrels.

5. The method of claim 1, wherein the widths of said first and second sidewall spacers are less than the critical dimension of the photolithographic exposure tool used to define said plurality of mandrels.

6. The method of claim 1, wherein after said anisotropic etch said first conformal layer of said second sidewall spacers abuts only sidewalls of mandrels of said second less than whole portion of said plurality of mandrels and said layer, and said first conformal layer intervenes between said second conformal layer and said layer.

7. A method, comprising:
   forming a first and a second mandrel on a layer on a substrate;
   forming a first conformal layer on sidewalls and top surfaces of said first and second mandrels and on a top surface of said layer between said first and second mandrels;
   forming a second conformal layer on a top surface of said first conformal layer;
   forming a block mask over said second mandrel and regions of said first and second conformal layers proximate to said second mandrel;
   using an isotropic etch, completely removing said second conformal layer where said second conformal layer is not protected by said block mask;
   removing said block mask;
   performing an anisotropic etch, said anisotropic etch forming first sidewall spacers on said first mandrel, said first sidewall spacers comprising first regions of said first conformal layer and no regions of said second conformal layer and forming second sidewall spacers on said second mandrel, said second sidewall spacers comprising second regions of said first conformal layer on sidewalls of said second mandrel and regions of said second conformal layer on said second regions of said first conformal layer, said first and second sidewall spacers having different widths, a width of said first sidewall spacers based on a thickness of said first conformal layer on sidewalls of said first mandrel and a width of said second sidewall spacers based on a thickness of said first and second conformal layers on sidewalls of said second mandrel;

removing said first and second mandrels; and
using said first and second sidewall spacers as a hardmask, simultaneously transferring the pattern formed by said first and second sidewall spacers into said layer.

8. The method of claim 7, wherein said first and second conformal layers do not fill the space between said first and second mandrels.

9. The method of claim 7, wherein:
a width of said first sidewall spacers proximate to said top surface of said layer is about equal to the thickness of said first conformal layer; and
a width of said second sidewall spacers proximate to said top surface of said layer is about equal to the thickness of said first conformal layer plus the thickness of said second conformal layer.

10. The method of claim 7, wherein said anisotropic etch removes said first conformal layer from top surfaces of mandrels of said first less than whole portion of said plurality of mandrels, removes said first and second conformal layers from the surface of said second mandrel, and removes said first and second conformal layers from said top surface of said layer between said first and second mandrels.

11. The method of claim 7, wherein said layer comprises silicon and said transferring the pattern formed by said first and second sidewall spacers into said layer comprises etching trenches in said layer where said layer is not protected by said first and second spacers and filling said trenches with a dielectric material.

12. The method of claim 7, wherein said layer comprises silicon and said transferring the pattern formed by said first and second sidewall spacers into said layer comprises ion implanting a dopant species into said layer where said layer is not protected by said first and second spacers.

13. The method of claim 7, wherein said layer comprises a layer of polysilicon over of a layer of gate dielectric and said transferring the pattern formed by said first and second sidewall spacers into said layer comprises removing said layer of polysilicon where said layer of polysilicon is not protected by said first and second spacers.

14. The method of claim 7, wherein the widths of said first and second sidewall spacers are less than the critical dimension of the photolithographic exposure tool used to define said first and second mandrels.

15. he method of claim 7, wherein after said anisotropic etch said first conformal layer of said second sidewall spacers abuts only sides of mandrels of said second mandrel and said layer, and said first conformal layer intervenes between said second conformal layer and said layer.

16. A method, comprising:
forming a first, a second and a third mandrel on a layer on a substrate;
forming a first conformal layer on sidewalls and top surfaces of said first, second and third mandrels and on a top surface of said layer between said first, second and third mandrels;
forming a second conformal layer on a top surface of said first conformal layer;
forming a first block mask over said second mandrel and regions of said first and second conformal layers proximate to said second mandrel;
using a first isotropic etch, removing said second conformal layer where said second conformal layer is not protected by said first block mask;
removing said first block mask;
forming a third conformal layer on exposed surfaces of said first and second conformal layers;
forming a second block mask on said third conformal layer over said second and third mandrels;
using a second isotropic etch, removing said third conformal layer where said third conformal layer is not protected by said second block mask;
performing an anisotropic etch to simultaneously form first sidewall spacers on said first mandrel, second sidewall spacers on said second mandrel and third sidewall spacers on said third mandrel, said first, second and third sidewall spacers having different widths;
removing said first, second and third mandrels; and
using said first, second and third sidewall spacers as a hardmask, simultaneously transferring the pattern formed by said first, second and third sidewall spacers into said layer.

17. The method of claim 16, including:
said first sidewall spacers comprising first remaining regions of said first conformal layer and no remaining regions of said second and third conformal layers;
said second sidewall spacers comprising second remaining regions of said first conformal layer on sidewalls of said second mandrel, first remaining regions of said second conformal layer on said second remaining regions of said first conformal layer and first remaining regions of said third conformal layer on said first remaining regions of said second conformal layer; and
said third spacer comprising third remaining regions of said first conformal layer on sidewalls of said third mandrel and second remaining regions of said third conformal layer on said third remaining regions of said first conformal layer and no remaining regions of said second conformal layer.

18. The method of claim 17, wherein:
said first remaining regions of said first conformal layer of said first spacer abut said layer;
said second remaining regions of said first conformal layer of said second sidewall spacer abut said layer, said first remaining regions of said second conformal layer of said second sidewall spacer and said first remaining regions of said third conformal layer of said second sidewall spacer do not abut said layer; and
said third remaining regions of said first conformal layer of said third sidewall spacer abut said layer, said second remaining regions of said third conformal layer of said second sidewall spacer do not abut said layer.

19. The method of claim 16, wherein said first, second and third conformal layers do not fill the space between said first, second and third mandrels.

20. The method of claim 16, wherein:
a width of said second sidewall spacers proximate to said top surface of said layer is about equal to the thickness of said first conformal layer;
a width of said second sidewall spacers proximate to said top surface of said layer is about equal to the thickness of said first conformal layer plus the thickness of said second conformal layer plus the thickness of said third conformal layer; and
a width of said third sidewall spacers proximate to said top surface of said layer is about equal to the thickness of said first conformal layer plus the thickness of said third conformal layer.

21. The method of claim 16, wherein said anisotropic etch removes said first conformal layer from the top surface of said first mandrel, removes said first, second and third conformal layers the top surface of said second mandrel, removes said first and third conformal layers from the top surface of said third mandrel, and removes regions of said first, second and third conformal layers said top surface of said layer between said first, second and third mandrels.

22. The method of claim 16, wherein the widths of at least two of said first, second and third sidewall spacers are less than the critical dimension of the photolithographic exposure tool used to define said first, second and third mandrels.

23. The method of claim 16, further including:
between said using a second isotropic etch, removing said third conformal layer where said third conformal layer is not protected by said second block mask and said performing an anisotropic etch to simultaneously form first sidewall spacers on said first mandrel, second sidewall spacers on said second mandrel and third sidewall spacers on said third mandrel, removing said second block mask.

24. A method comprising:
forming N mandrels on a top surface of a layer of a substrate, wherein N is a positive integer equal to or greater than 2;
depositing N conformal layers;
removing regions of N-1 conformal layers using a different block mask of N-1 block masks between depositions of each of the last 2 to N conformal layers, such that for I=1 to N, the Ith mandrel has I conformal layers on sidewall of said Ith mandrel, each of said N mandrels having a different number and a different combination of said N conformal layers;
using an anisotropic etch, forming a sidewall spacer on each sidewall of said N mandrels, for I=1 to N, the Ith mandrel having a sidewall comprising only I of said N conformal layers;
removing said N mandrels; and
using said N sidewall spacers as a hardmask, simultaneously transferring the pattern formed by said N sidewall spacers into said layer.

25. A method comprising:
forming N mandrels on a top surface of a layer of a substrate, wherein N is a positive integer equal to or greater than 3;
depositing N conformal layers;
using an isotropic etch, removing regions of N-1 conformal layers and using a different block mask of N-1 block masks between depositions of each of the last 3 to N conformal layers, such that for I=1 to N, the Ith mandrel has I conformal layers on sidewall of said Ith mandrel, each of said N mandrels having a different number and a different combination of said N conformal layers;
using an anisotropic etch, forming a sidewall spacer on each sidewall of said N mandrels, for I=1 to N, the Ith mandrel having a sidewall comprising only I of said N conformal layers;
removing said N mandrels; and
using said N sidewall spacers as a hardmask, simultaneously transferring the pattern formed by said N sidewall spacers into said layer.

* * * * *